(12) United States Patent
Shioda et al.

(10) Patent No.: US 10,868,030 B2
(45) Date of Patent: Dec. 15, 2020

(54) SEMICONDUCTOR DEVICE AND METHOD FOR MANUFACTURING SAME

(71) Applicant: Toshiba Memory Corporation, Minato-ku (JP)

(72) Inventors: Tomonari Shioda, Yokkaichi (JP); Tatsuo Ishida, Kuwana (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/915,533

(22) Filed: Mar. 8, 2018

(65) Prior Publication Data
US 2019/0067318 A1    Feb. 28, 2019

(30) Foreign Application Priority Data

Aug. 28, 2017  (JP) .................. 2017-163635

(51) Int. Cl.
H01L 27/1157      (2017.01)
H01L 27/11582     (2017.01)
H01L 27/11524     (2017.01)
H01L 27/11556     (2017.01)

(52) U.S. Cl.
CPC .... H01L 27/11582 (2013.01); H01L 27/1157 (2013.01); H01L 27/11524 (2013.01); H01L 27/11556 (2013.01)

(58) Field of Classification Search
CPC ......... H01L 27/11582; H01L 27/11524; H01L 27/11556; H01L 27/1157
See application file for complete search history.

(56) References Cited

U.S. PATENT DOCUMENTS

| 9,064,736 | B2 | 6/2015 | Lee et al. |
| 9,076,879 | B2 | 7/2015 | Yoo et al. |
| 9,257,552 | B2 | 2/2016 | Mizushima |
| 9,559,111 | B2 | 1/2017 | Yoo et al. |
| 9,653,472 | B2 | 5/2017 | Lee et al. |
| 2009/0294844 | A1* | 12/2009 | Tanaka .............. H01L 27/11578 257/330 |
| 2013/0134492 | A1 | 5/2013 | Yang et al. |
| 2014/0220750 | A1* | 8/2014 | Sohn ................. H01L 27/11556 438/269 |
| 2016/0343730 | A1* | 11/2016 | Son ....................... H01L 23/528 |
| 2017/0110543 | A1* | 4/2017 | Shin ..................... H01L 21/764 |
| 2019/0035804 | A1* | 1/2019 | Kim ..................... H01L 23/528 |

* cited by examiner

Primary Examiner — Matthew C Landau
Assistant Examiner — Dmitriy Yemelyanov
(74) Attorney, Agent, or Firm — Oblon, McClelland, Maier & Neustadt, L.L.P.

(57) ABSTRACT

According to one embodiment, the substrate includes a plurality of protrusions having columnar configurations, and a void being formed below the protrusions. The stacked body is provided on the substrate. The stacked body includes a plurality of electrode layers stacked with an insulator interposed. The semiconductor body contacts the protrusion and extends through the stacked body in a stacking direction of the stacked body. Upper ends of the protrusions are positioned at a height between a lowermost electrode layer and an electrode layer of a second layer from a bottom of the electrode layers.

9 Claims, 14 Drawing Sheets

SEMICONDUCTOR DEVICE AND METHOD FOR MANUFACTURING SAME

CROSS-REFERENCE TO RELATED APPLICATION

This application is based upon and claims the benefit of priority from Japanese Patent Application No. 2017-163635, filed on Aug. 28, 2017; the entire contents of which are incorporated herein by reference.

FIELD

Embodiments described herein relate generally to a semiconductor device and a method for manufacturing a semiconductor device.

BACKGROUND

As a method for manufacturing a three-dimensional memory device, a method has been proposed in which multiple holes are formed; and a semiconductor material is epitaxially grown from the bottom surfaces of the holes. Fluctuation of the depth between the multiple holes occurs easily when the aspect ratio of the multiple holes becomes high. The fluctuation of the depth causes fluctuation of the upper surface height of the semiconductor material grown from the bottom surfaces of the holes bottom surfaces, which may affect the device characteristics and/or the yield.

DETAILED DESCRIPTION

Figure 1:
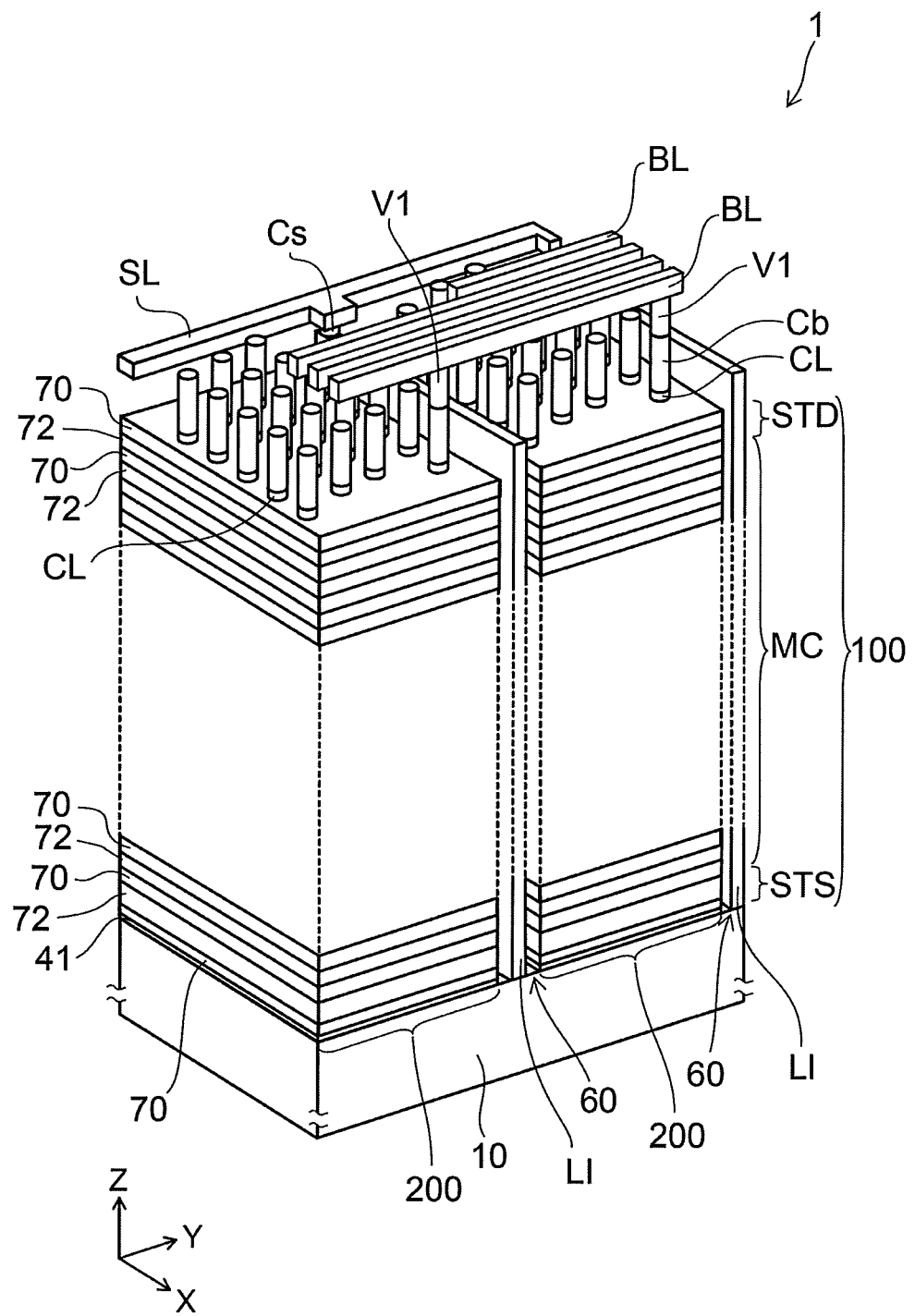
FIG. 1 is a schematic perspective view of a semiconductor device of an embodiment.

According to one embodiment, a semiconductor device includes a substrate, a stacked body, and a semiconductor body. The substrate includes a plurality of protrusions having columnar configurations, and a void being formed below the protrusions. The stacked body is provided on the substrate. The stacked body includes a plurality of electrode layers stacked with an insulator interposed. The semiconductor body contacts the protrusion and extends through the stacked body in a stacking direction of the stacked body. Upper ends of the protrusions are positioned at a height between a lowermost electrode layer and an electrode layer of a second layer from a bottom of the electrode layers.

Hereinafter, embodiments will be described with reference to the drawings. Incidentally, in the respective drawings, the same components are denoted by the same reference numerals.

In an embodiment, for example, a semiconductor memory device that includes a memory cell array having a three-dimensional structure is described as a semiconductor device.

FIG. 1 is a schematic perspective view of the memory cell array 1 of the embodiment.

Figure 2:
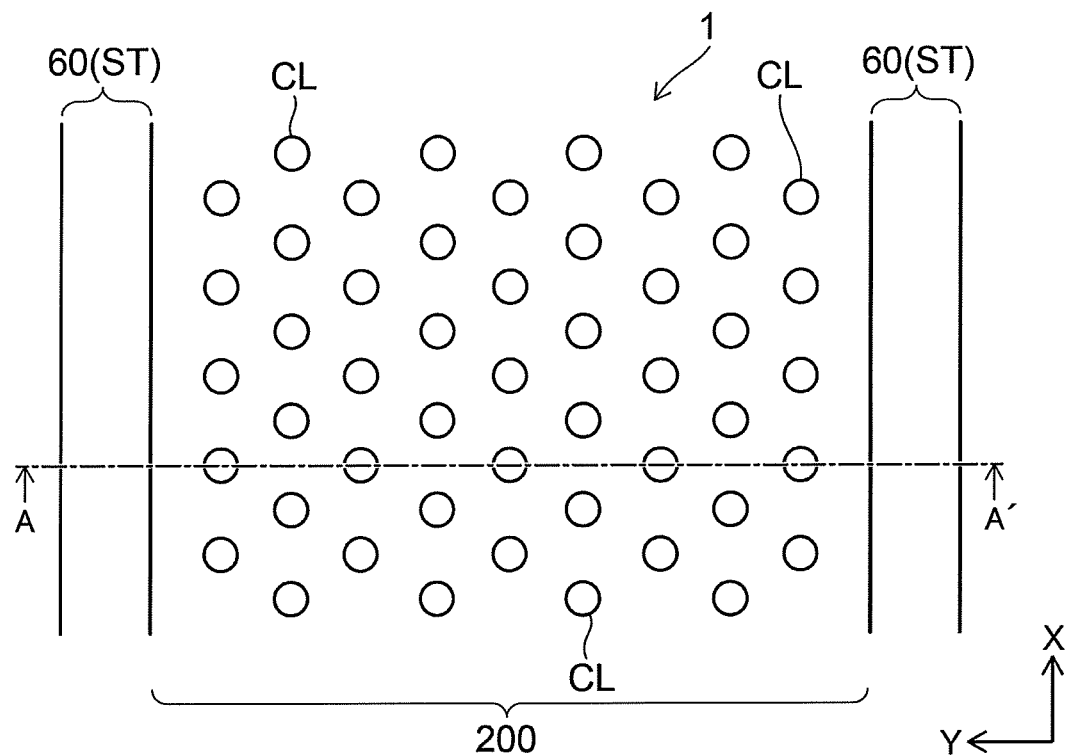
FIG. 2 is a schematic plan view of the semiconductor device of the embodiment.

FIG. 2 is a schematic plan view of the memory cell array 1.

Figure 3:
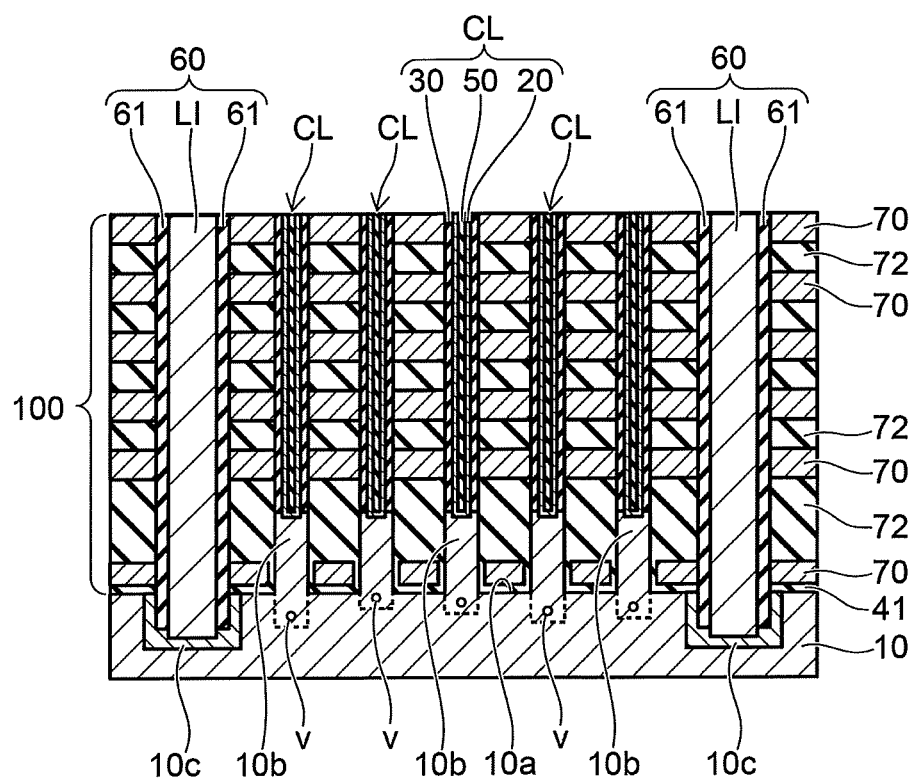
FIG. 3 is an A-A' cross-sectional view of FIG. 2.

FIG. 3 is an A-A' cross-sectional view of FIG. 2.

In FIG. 1, two mutually-orthogonal directions parallel to a major surface of a substrate 10 are taken as an X-direction and a Y-direction; and a direction orthogonal to both the X-direction and the Y-direction is taken as a Z-direction (a stacking direction).

The memory cell array 1 includes the substrate 10, a stacked body 100 provided on the substrate 10, multiple columnar portions CL, multiple separation portions 60, and upper layer interconnects provided above the stacked body 100. In FIG. 1, for example, bit lines BL and a source line SL are shown as the upper layer interconnects.

The columnar portions CL are formed in substantially circular columnar configurations extending through the stacked body 100 in the stacking direction of the stacked body 100 (the Z-direction). The separation portions 60 spread on the substrate 10 in the Z-direction and the X-direction and divide the stacked body 100 into multiple blocks (or fingers) 200 in the Y-direction.

For example, the multiple columnar portions CL have a staggered arrangement. Or, the multiple columnar portions CL may have a square lattice arrangement along the X-direction and the Y-direction.

The multiple bit lines BL are provided above the stacked body 100. The multiple bit lines BL are, for example, metal films extending in the Y-direction. The multiple bit lines BL are separated from each other in the X-direction.

The upper end of a semiconductor body 20 of the columnar portion CL described below is connected to the bit line BL via a contact Cb and a contact V1 shown in FIG. 1.

As shown in FIG. 3, the substrate 10 includes multiple protrusions 10b. The substrate 10 including the protrusions 10b is a semiconductor substrate and is, for example, a silicon substrate including mainly silicon.

The protrusions 10b protrude upward from an upper surface 10a of the substrate 10. The protrusions 10b that have columnar configurations are provided under the columnar portions CL. The multiple protrusions 10b are provided to correspond to the multiple columnar portions CL.

As described below, the protrusions 10b are silicon crystal layers epitaxially grown in memory holes MH formed in the substrate 10.

The stacked body 100 is provided on the upper surface 10a of the substrate 10. The stacked body 100 includes multiple electrode layers 70. The multiple electrode layers 70 are stacked in a direction (the Z-direction) perpendicular to the upper surface 10a of the substrate 10 with insulating layers (insulators) 72 interposed. The electrode layers 70 are metal layers and are, for example, tungsten layers or molybdenum layers. An insulating layer 41 is provided between the upper surface 10a of the substrate 10 and the lowermost electrode layer 70.

Figure 4A:
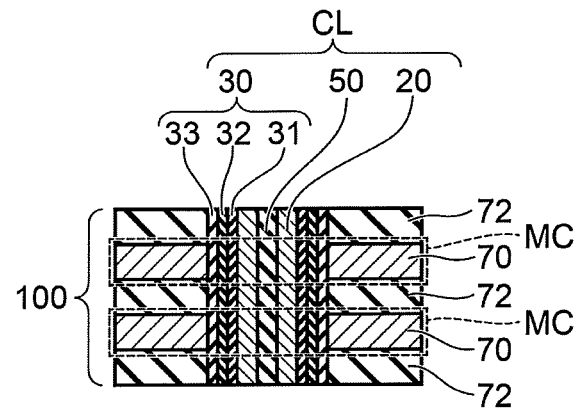
FIGS. 4A and 4B are enlarged views of a portion of FIG. 3.
Figure 4B:
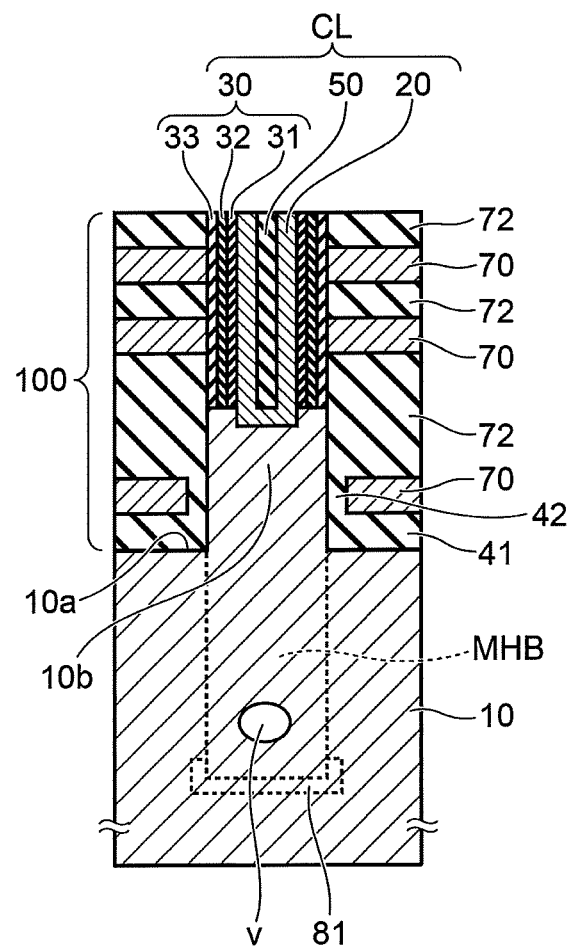

FIG. 4B is an enlarged view of a portion of FIG. 3 where the protrusion 10b is provided.

FIG. 4A is an enlarged view of one portion of the stacked body 100 higher than the portion of FIG. 4B.

As shown in FIG. 4B, the upper end of the protrusion 10b is positioned at a height between the lowermost electrode layer 70 and the electrode layer 70 of the second layer from the bottom.

The lowermost electrode layer 70 surrounds the side surface of the protrusion 10b having the columnar configuration higher than the upper surface 10a of the substrate 10. The lowermost electrode layer 70 is positioned at a height lower than the lower end of the columnar portion CL.

An insulating film 42 is provided between the side surface of the protrusion 10b and the lowermost electrode layer 70. The side surface of the protrusion 10b is covered with the lowermost insulating layer 72, the insulating film 42, and the insulating layer 41.

The distance between the lowermost electrode layer 70 and the electrode layer 70 of the second layer from the bottom is greater than the distance between the other electrode layers 70. The thickness of the lowermost insulating layer 72 is thicker than the thicknesses of the other insulating layers 72.

The columnar portion CL includes a memory film 30, the semiconductor body 20, and an insulative core film 50. The semiconductor body 20, the memory film 30, and the core film 50 extend in the stacking direction of the stacked body 100 on the protrusion 10b.

The semiconductor body 20 is formed in a pipe-like configuration; and the core film 50 is provided on the inner side of the semiconductor body 20. The memory film 30 is provided between the semiconductor body 20 and the electrode layers 70 higher than the lowermost electrode layer 70 and surrounds the periphery of the semiconductor body 20.

The semiconductor body 20 is a silicon film; and the lower end portion of the semiconductor body 20 contacts the protrusion 10b. The upper end portion of the semiconductor body 20 is connected to the bit line BL via the contact Cb and the contact V1 shown in FIG. 1.

The memory film 30 is a stacked film including a tunneling insulating film 31, a charge storage film (a charge storage portion) 32, and a blocking insulating film 33.

The blocking insulating film 33, the charge storage film 32, and the tunneling insulating film 31 are provided between the semiconductor body 20 and the electrode layers 70 higher than the lowermost electrode layer 70 in order from the electrode layer 70 side.

The semiconductor body 20, the memory film 30, and the electrode layer 70 are included in a memory cell MC. As shown in FIG. 4A, the memory cell MC has a vertical transistor structure in which the electrode layer 70 surrounds the periphery of the semiconductor body 20 with the memory film 30 interposed.

In the memory cell MC that has the vertical transistor structure, the semiconductor body 20 functions as a channel; and the electrode layer 70 functions as a control gate. The charge storage film 32 functions as a data storage layer that stores charge injected from the semiconductor body 20.

The semiconductor memory device of the embodiment is a nonvolatile semiconductor memory device that can freely and electrically erase/program data and can retain the memory content even when the power supply is OFF.

The memory cell MC is, for example, a charge trap memory cell. The charge storage film 32 has many trap sites that trap charge inside an insulative film and includes, for example, a silicon nitride film. Or, the charge storage film 32 may be a conductive floating gate surrounded with an insulator.

The tunneling insulating film 31 is used as a potential barrier when the charge is injected from the semiconductor body 20 into the charge storage film 32 or when the charge stored in the charge storage film 32 is discharged into the semiconductor body 20. The tunneling insulating film 31 includes, for example, a silicon oxide film.

The blocking insulating film 33 prevents the charge stored in the charge storage film 32 from being discharged into the electrode layer 70. Also, the blocking insulating film 33 prevents back-tunneling of electrons from the electrode layer 70 into the columnar portion CL.

The blocking insulating film 33 includes, for example, a silicon oxide film. Or, a stacked film of a silicon oxide film and a metal oxide film having a higher dielectric constant than the silicon oxide film may be provided as the blocking insulating film between the charge storage film 32 and the electrode layer 70.

As shown in FIG. 1, a drain-side selection transistor STD is provided in the upper layer portion of the stacked body 100; and a source-side selection transistor STS is provided in the lower layer portion of the stacked body 100.

The multiple memory cells MC are provided between the drain-side selection transistor STD and the source-side selection transistor STS. The multiple memory cells MC, the drain-side selection transistor STD, and the source-side selection transistor STS are connected in series via the semiconductor body 20 of the columnar portion CL and are included in one memory string. For example, the memory strings have a staggered arrangement in a planar direction parallel to the XY plane; and the multiple memory cells MC are provided three-dimensionally in the X-direction, the Y-direction, and the Z-direction.

The separation portion 60 will now be described.

As shown in FIG. 3, the separation portion 60 includes an interconnect portion LI and an insulating film 61. The interconnect portion LI spreads in the X-direction and the Z-direction in FIG. 1 and is, for example, a film including a metal. The insulating film 61 is provided on the side surface of the interconnect portion LI. The insulating film 61 is provided between the stacked body 100 and the interconnect portion LI.

As shown in FIG. 3, multiple semiconductor regions 10c are formed in the surface of the substrate 10. The lower ends of the interconnect portions LI contact the semiconductor regions 10c. The multiple semiconductor regions 10c are provided to correspond to the multiple interconnect portions LI. The semiconductor regions 10c are, for example, N-type silicon regions. The upper ends of the interconnect portions LI are connected to the source lines SL via contacts Cs shown in FIG. 1.

In the read operation, electrons are supplied from the interconnect portion LI to the semiconductor body 20 via the semiconductor region 10c, the surface of the substrate 10, and the protrusion 10b.

The lowermost electrode layer 70 functions as a control gate of a bottom transistor; and the insulating layer 41 and the insulating film 42 shown in FIG. 4B function as gate insulating films of the bottom transistor. The bottom transistor has a structure in which the lowermost electrode layer 70 surrounds the periphery of the protrusion 10b with the insulating film 42 interposed. The lowermost electrode layer 70 also opposes the upper surface 10a of the substrate 10 with the insulating layer 41 interposed.

The source-side selection transistor STS described above includes at least the bottom transistor. Or, the source-side selection transistor STS may include multiple transistors in which the electrode layers 70 of multiple layers from the bottom including the lowermost electrode layer 70 are used as control gates.

By controlling the potential applied to the lowermost electrode layer 70, an inversion layer (an N-channel) can be induced at the vicinity of the upper surface 10a of the substrate 10 and the vicinity of the side surface of the protrusion 10b; and a current can be caused to flow between the semiconductor region 10c and the lower end of the semiconductor body 20.

As shown in FIG. 4B, a void v is formed below the protrusion 10b inside the substrate 10. The void v is positioned lower than the upper surface 10a of the substrate 10 and is not formed inside the protrusion 10b.

A high impurity concentration region 81 is formed below the void v inside the substrate 10. In the example shown in FIG. 4B, the region 81 includes, for example, chlorine (Cl). The chlorine concentration of the region 81 is higher than the chlorine concentration of the region inside the substrate 10 above the void v and the chlorine concentration of the protrusion 10b.

A method for manufacturing the semiconductor device of the embodiment will now be described with reference to FIG. 5 to FIG. 13.

Figure 5:
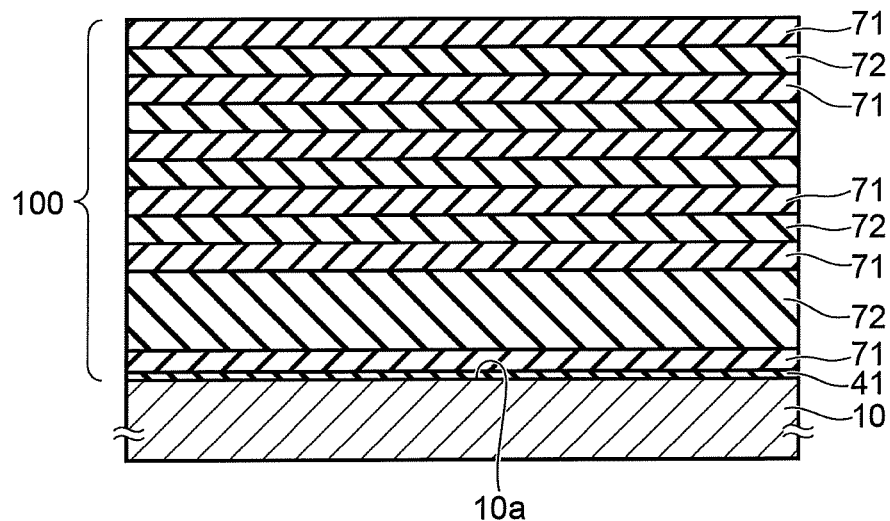
FIG. 5 to FIG. 13 are schematic cross-sectional views showing a method for manufacturing the semiconductor device of the embodiment.

As shown in FIG. 5, the insulating layer 41 is formed on the upper surface 10a of the substrate 10; and a sacrificial layer 71 as a first layer and the insulating layer 72 as a second layer are stacked alternately on the insulating layer 41. The multiple sacrificial layers 71 and the multiple insulating layers 72 are formed on the substrate 10 by repeating the process of alternately stacking the sacrificial layer 71 and the insulating layer 72. For example, the sacrificial layer 71 is a silicon nitride layer; and the insulating layer 72 is a silicon oxide layer.

Figure 6:
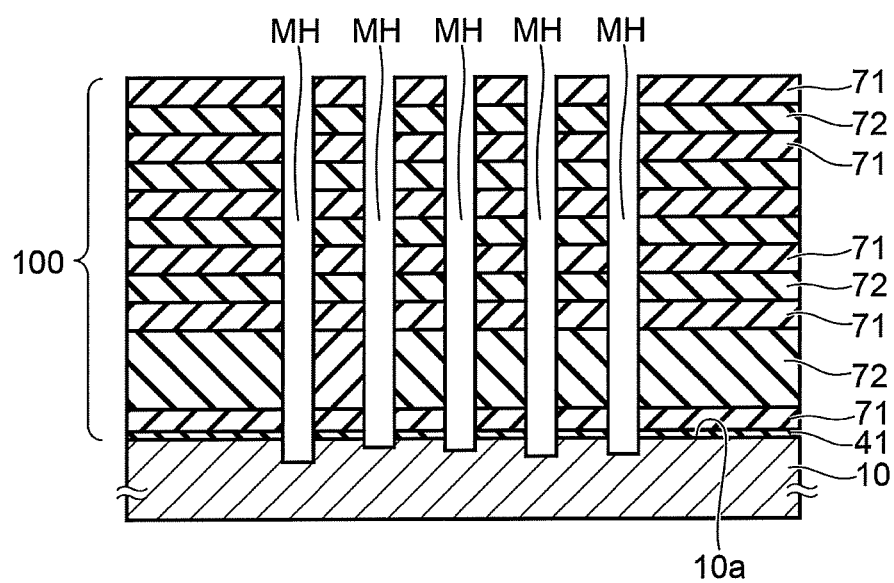

As shown in FIG. 6, for example, the multiple memory holes MH are formed in the stacked body 100 by RIE (reactive ion etching) using a not-illustrated mask. The memory holes MH pierce the stacked body 100 and reach the substrate 10.

Figure 7A:
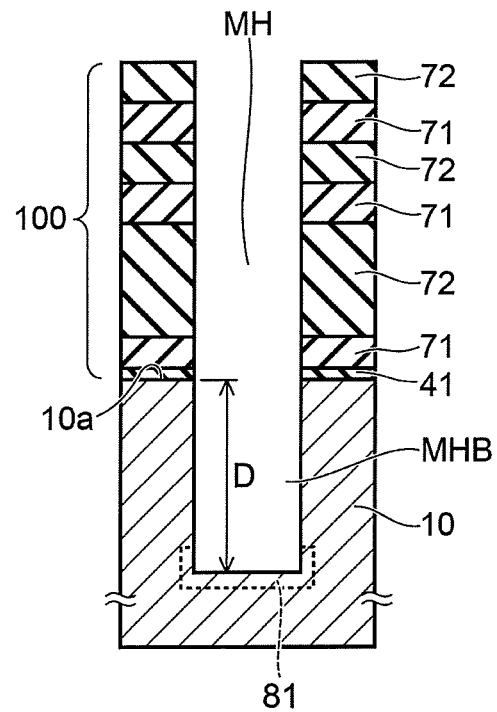

As shown in FIG. 7A, the bottom surface of the memory hole MH is positioned deeper than the upper surface 10a of the substrate 10. A depth D of a bottom region MHB of the memory hole MH below the upper surface 10a of the substrate 10 is larger than the diameter of the memory hole MH. The aspect ratio of the bottom region MHB is greater than 1. The multiple memory holes MH can be caused to reach the substrate 10 reliably by controlling the RIE time so that the aspect ratio of the bottom region MHB is greater than 1.

The substrate 10 is exposed at the side wall and the bottom surface of the bottom region MHB of the memory hole MH. The silicon crystal which is the same semiconductor material as the substrate 10 is epitaxially grown from the exposed portion of the substrate 10.

For example, the memory hole MH is formed by RIE using a gas including chlorine ($Cl_2$). In the RIE, the crystal orientation of the silicon at the vicinity of the bottom surface of the memory hole MH is disturbed due to damage due to the implantation of the chlorine accelerated in the depth direction of the memory hole MH. The region 81 that includes chlorine is formed at the vicinity of the bottom surface of the memory hole MH. The chlorine concentration of the region 81 is higher than the chlorine concentration of the vicinity of the side wall of the bottom region MHB.

The region 81 functions as a growth inhibition region that obstructs the growth of the silicon from the bottom surface of the bottom region MHB. Accordingly, the growth of the silicon is promoted selectively (preferentially) more from the side wall than from the bottom surface of the bottom region MHB.

The growth rate of the silicon from the bottom surface of the bottom region MHB is slower than the growth rate of the silicon from the side wall of the bottom region MHB. Or, at the growth start of the silicon, the incubation time of the silicon grown from the bottom surface of the bottom region MHB is longer than the incubation time of the silicon grown from the side wall of the bottom region MHB.

Figure 7B:
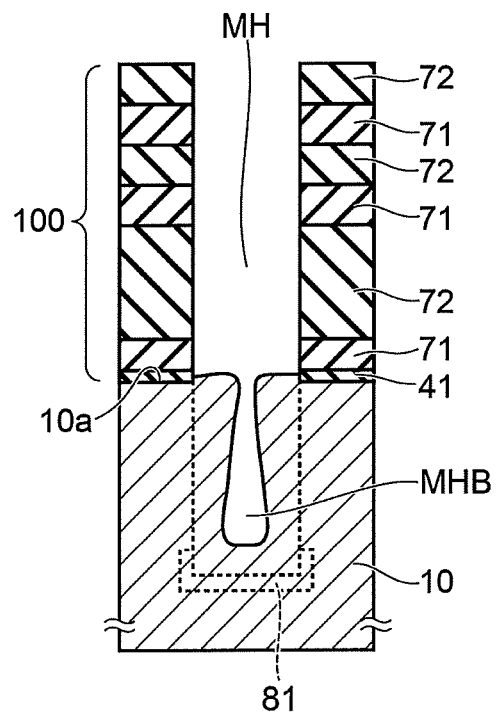
Figure 8A:
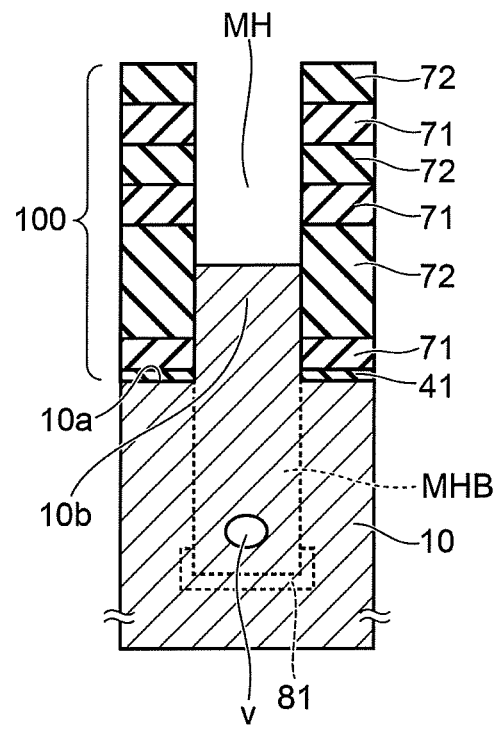

Thus, by growing the silicon selectively (preferentially) from the side wall of the bottom region MHB, the protrusion 10b is formed in the lower region of the memory hole MH as shown in FIG. 8A by the process of FIG. 7B.

The silicon that is grown in the lateral direction from the side wall of the bottom region MHB unites together and plugs the memory hole MH at a position higher than the upper surface 10a of the substrate 10. After plugging the memory hole MH, the silicon is grown further and controlled so that the upper end of the protrusion 10b is positioned at a height between the lowermost sacrificial layer 71 and the sacrificial layer 71 of the second layer from the bottom.

By obstructing the growth from the bottom surface of the memory hole MH, the silicon (the protrusion 10b) plugs the memory hole MH while forming the void v at the bottom surface vicinity of the memory hole MH.

Figure 8B:
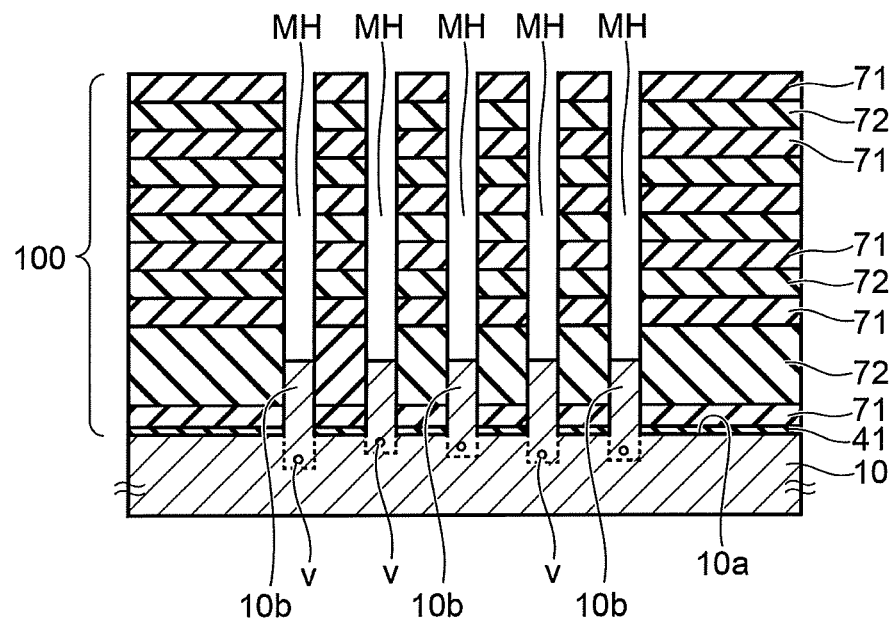

As shown in FIG. 8B, the multiple protrusions 10b are formed to correspond to the multiple memory holes MH; and the voids v are formed below 90% or more of the protrusions 10b of the multiple protrusions 10b.

According to the embodiment, because the silicon growth from the side wall of the bottom region MHB is caused to be dominant in the formation of the protrusion 10b, it is possible to suppress the fluctuation of the upper end position (the upper end height) between the multiple protrusions 10b even in the case where the depths (the positions of the bottom surfaces) of the multiple memory holes MH fluctuate due to the RIE.

The uniformity of the upper end positions (the upper end heights) of the multiple protrusions 10b reduces the fluctuation of the cell current between the multiple semiconductor bodies 20, prevents leaks between the electrode layers 70 via the protrusion 10b, and increases the yield.

Figure 9A:
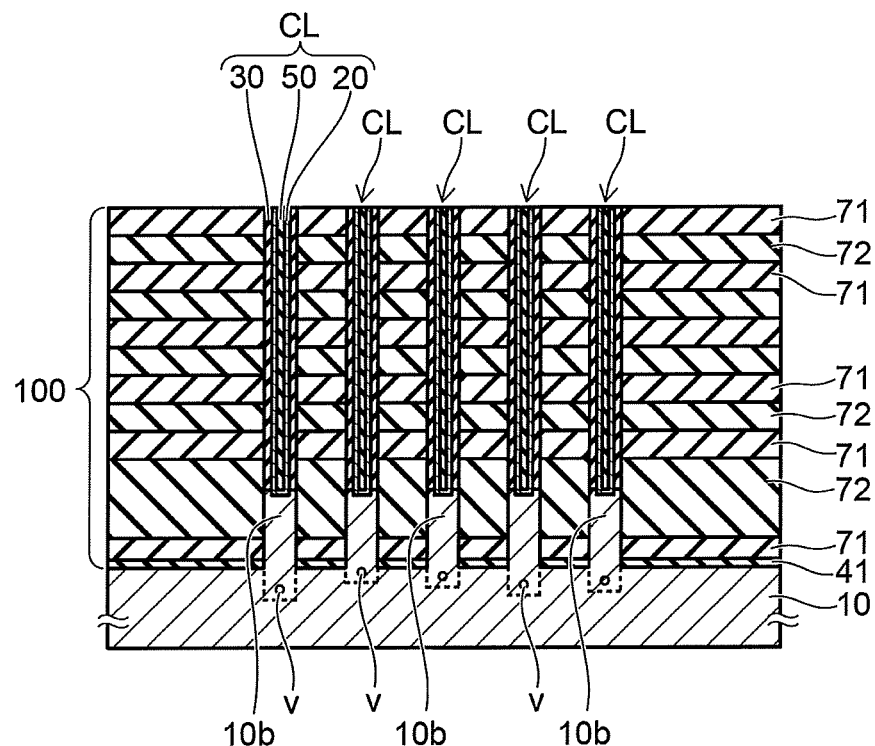
Figure 9B:
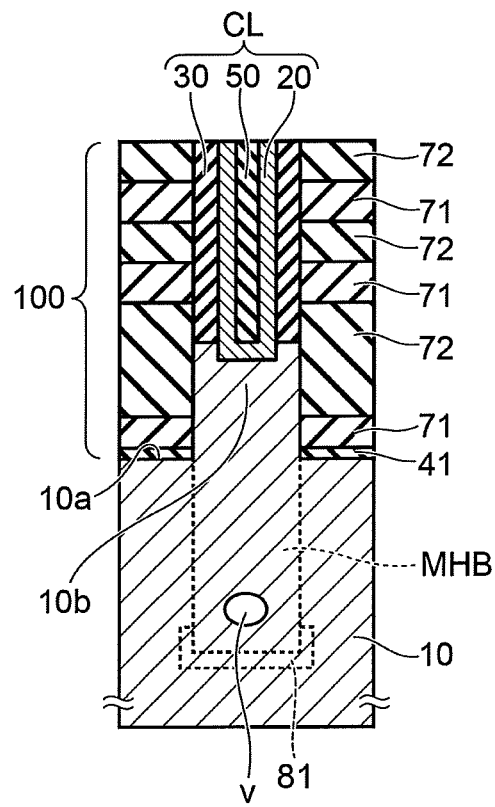

After forming the protrusions 10b, the columnar portions CL are formed inside the memory holes MH on the protrusions 10b as shown in FIG. 9A and FIG. 9B. The memory film 30, the semiconductor body 20, and the core film 50 are formed in order inside the memory holes MH. The lower end portions of the semiconductor bodies 20 contact the protrusions 10b.

Figure 10:
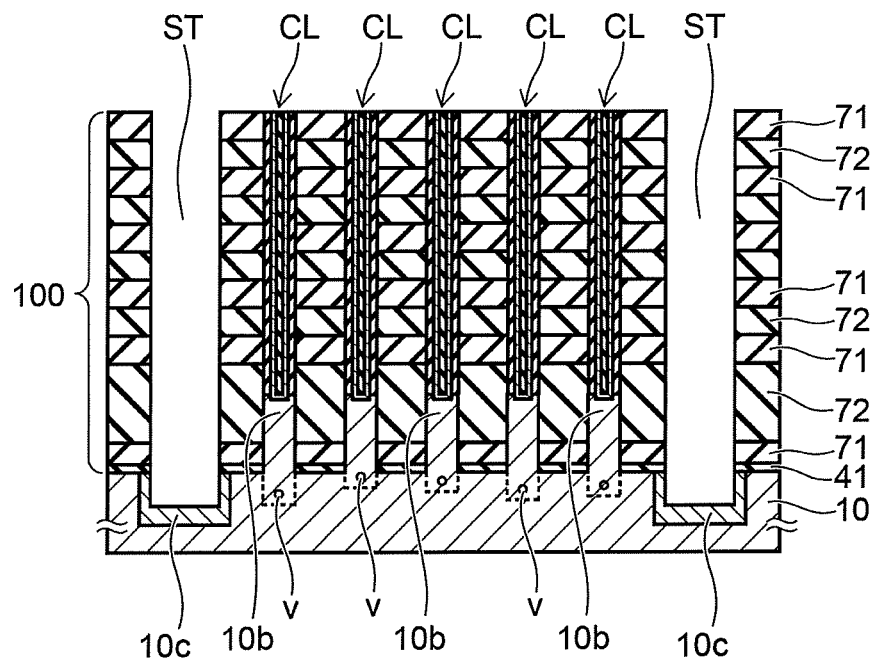

After forming the columnar portions CL, multiple slits ST are formed in the stacked body 100 as shown in FIG. 10. The slits ST are formed by RIE using a not-illustrated mask. The slits ST pierce the stacked body 100 and reach the substrate 10.

The semiconductor regions 10c are formed by implanting an impurity by ion implantation into the region of the substrate 10 exposed at the bottoms of the slits ST.

Then, the sacrificial layers 71 are removed by an etchant or an etching gas supplied through the slits ST. For example, the sacrificial layers 71 which are silicon nitride layers are removed using an etchant including phosphoric acid.

Figure 11:
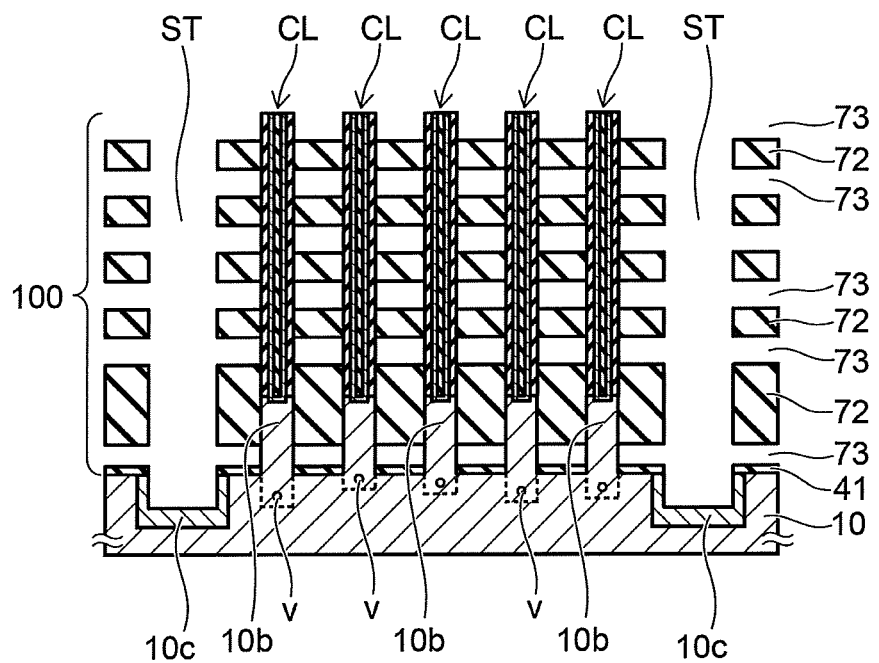
Figure 12A:
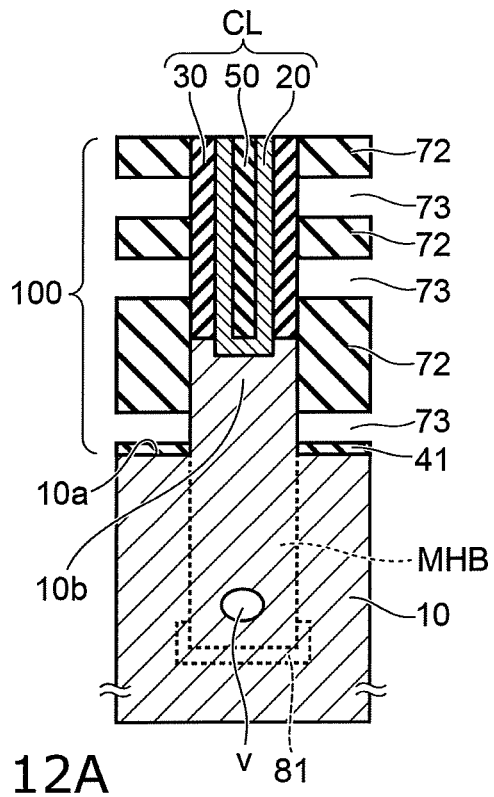

The sacrificial layers 71 are removed; and an air gap 73 is formed between the insulating layers 72 adjacent to each other above and below as shown in FIG. 11 and FIG. 12A. The air gap 73 is formed also between the insulating layer 41 and the lowermost insulating layer 72.

The multiple insulating layers 72 contact the side surfaces of the multiple columnar portions CL to surround the side surfaces. The multiple insulating layers 72 are supported by such a physical bond with the multiple columnar portions CL; and the air gap 73 is maintained.

Figure 12B:
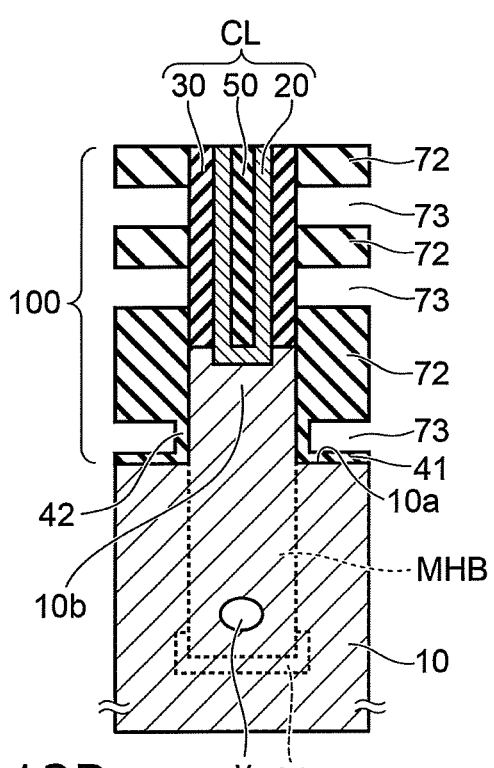

As shown in FIG. 12A, the side surface of the protrusion 10b is exposed in the air gap 73 formed between the insulating layer 41 and the lowermost insulating layer 72. For example, an insulating film (a silicon oxide film) is grown by thermal oxidation at the exposed portion. As shown in FIG. 12B, the insulating film 42 is formed on the side surface of the protrusion 10b.

Figure 13:
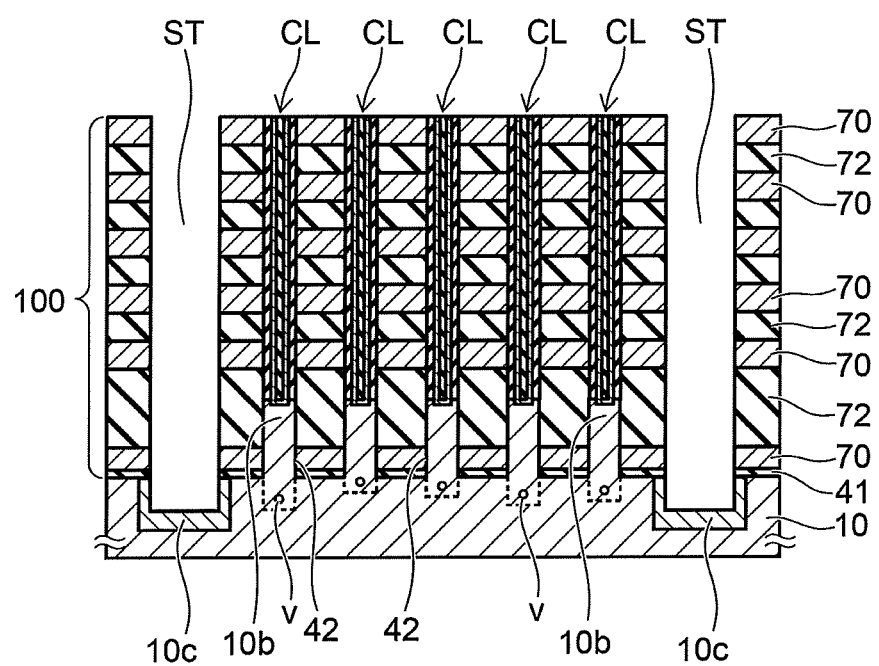

Subsequently, the electrode layers 70 are formed in the gap 73 as shown in FIG. 13. For example, tungsten layers or molybdenum layers are formed as the electrode layers 70 by CVD (chemical vapor deposition). A source gas is supplied to the air gap 73 through the slits ST.

After forming the electrode layers 70, the separation portion 60 that includes the insulating film 61 and the interconnect portion LI shown in FIG. 3 is formed inside the slit ST. The lower end portion of the interconnect portion LI contacts the semiconductor region 10c.

Figure 14:
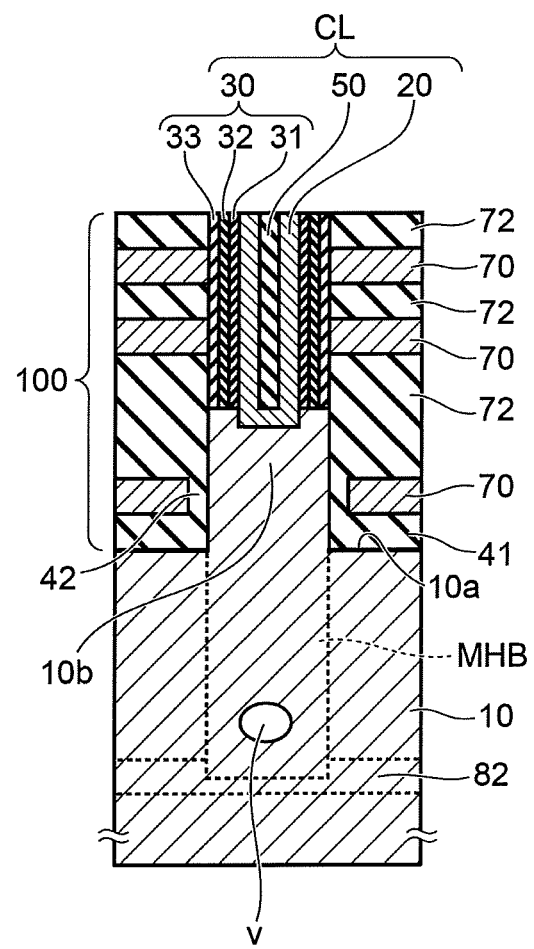
FIG. 14 is a schematic enlarged cross-sectional view of a portion of the semiconductor device of the embodiment.

FIG. 14 is a schematic cross-sectional view of a portion similar to FIG. 4B.

The void v is formed below the protrusion 10b inside the substrate 10. The impurity concentration of the substrate 10 has a distribution in the thickness direction; and the impurity concentration has a peak at the vicinity of the bottom surface of the bottom region MHB described above.

In other words, a high impurity concentration region 82 is formed below the void v inside the substrate 10. The region 82 includes, for example, carbon (C) as the impurity. The carbon concentration of the region 82 is, for example, $3\times10^{19}$ cm$^{-3}$ or more and is higher than the carbon concentration of the region inside the substrate 10 above the void v and the carbon concentration of the protrusion 10b.

Or, the region 82 includes, for example, phosphorus (P) as the impurity. The phosphorus concentration of the region 82 is, for example, $3\times10^{19}$ cm$^{-3}$ or more and is higher than the phosphorus concentration of the region inside the substrate 10 above the void v and the phosphorus concentration of the protrusion 10b. Or, the impurity may be oxygen (O), nitrogen (N), or fluorine (F). For the oxygen, the nitrogen, or the fluorine, the impurity concentration of the region 82 is higher than the impurity concentration of the region inside the substrate 10 above the void v and the impurity concentration of the protrusion 10b.

Such a region 82 functions as a growth inhibition region that obstructs the growth of the silicon from the bottom surface of the bottom region MHB. Accordingly, the growth of the silicon is promoted selectively (preferentially) more from the side wall than from the bottom surface of the bottom region MHB. By growing the silicon selectively (preferentially) from the side wall of the bottom region MHB, the protrusion 10b is formed in the lower region of the memory hole MH.

By obstructing the growth from the bottom surface of the memory hole MH, the silicon (the protrusion 10b) plugs the memory hole MH while forming the void v at the vicinity of the bottom surface of the memory hole MH.

In the example shown in FIG. 14 as well, because the silicon growth from the side wall of the bottom region MHB is caused to be dominant in the formation of the protrusion 10b, it is possible to suppress the fluctuation of the upper end position (the upper end height) between the multiple protrusions 10b even in the case where the depths (the positions of the bottom surfaces) of the multeiple memory holes MH fluctuate due to the RIE.

Figure 15:
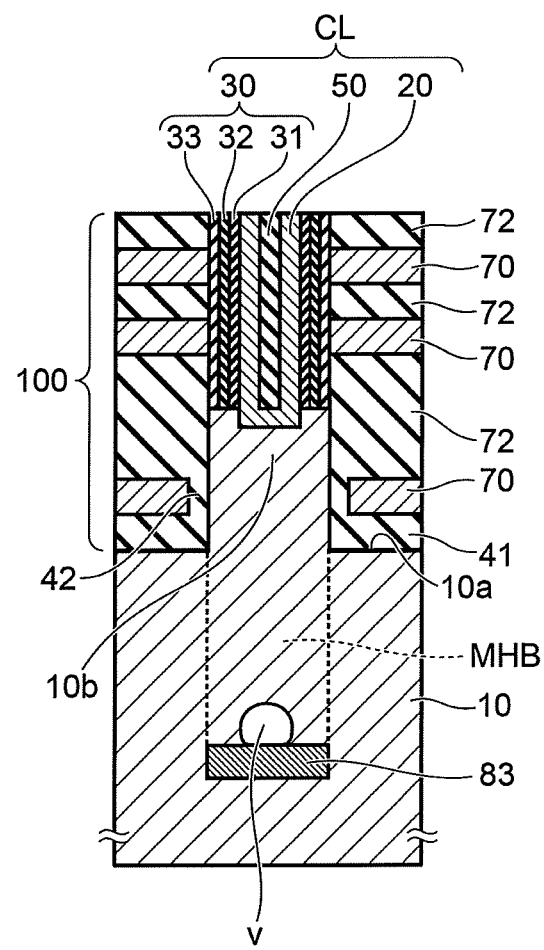
FIG. 15 is a schematic enlarged cross-sectional view of a portion of the semiconductor device of the embodiment.

FIG. 15 is a schematic cross-sectional view of a portion similar to FIG. 4B.

The void v is formed below the protrusion 10b inside the substrate 10. A film 83 of a material different from the substrate 10 is provided below the void v inside the substrate 10. The film 83 is, for example, a silicon oxide film or a silicon nitride film.

Such a film 83 functions as a growth inhibition region that obstructs the growth of the silicon from the bottom surface of the bottom region MHB. Accordingly, the growth of the silicon is promoted selectively (preferentially) more from the side wall than from the bottom surface of the bottom region MHB. By growing the silicon selectively (preferentially) from the side wall of the bottom region MHB, the protrusion 10b is formed in the lower region of the memory hole MH.

By obstructing the growth from the bottom surface of the memory hole MH, the silicon (the protrusion 10b) plugs the memory hole MH while forming the void v at the vicinity of the bottom surface of the memory hole MH.

In the example shown in FIG. 15 as well, because the silicon growth from the side wall of the bottom region MHB is caused to be dominant in the formation of the protrusion 10b, it is possible to suppress the fluctuation of the upper end position (the upper end height) between the multiple protrusions 10b even in the case where the depths (the positions of the bottom surfaces) of the multiple memory holes MH fluctuate due to the RIE.

Figure 16A:
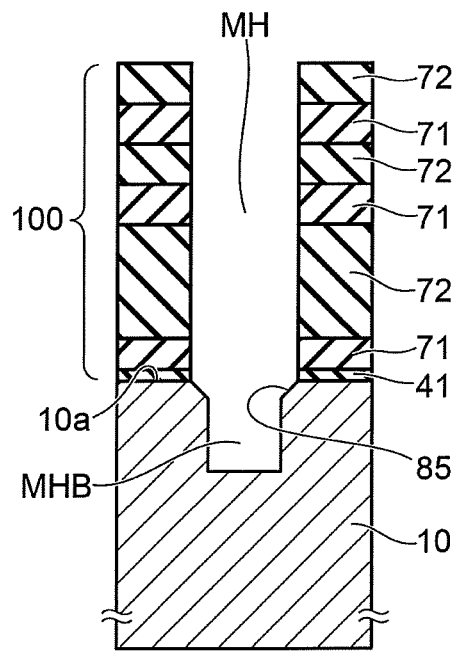
FIG. 16A to FIG. 17 are schematic cross-sectional views showing a method for manufacturing the semiconductor device of the embodiment.
Figure 16B:
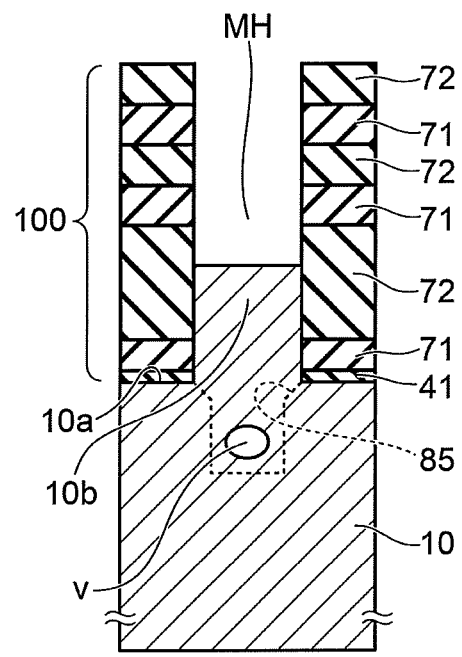
Figure 17:
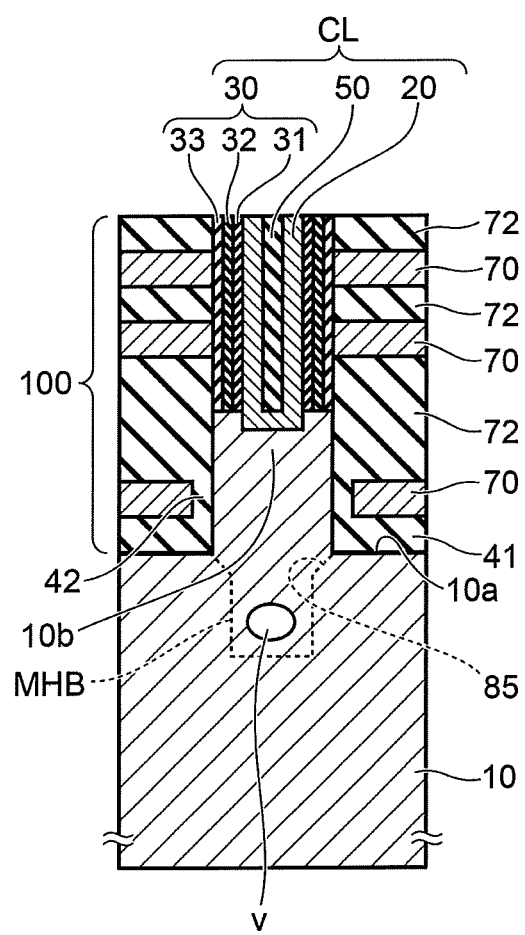

FIG. 16A to FIG. 17 are schematic cross-sectional views showing another example of the method for forming the protrusion 10b.

After forming the memory hole MH, the (111) plane (the facet) 85 of the silicon crystal is exposed as shown in FIG. 16A.

After forming the memory hole MH, as necessary, the shoulder portion of the bottom region MHB is exposed by enlarging the diameter of the lower portion of the memory hole MH; and the (111) plane 85 is exposed by, for example, wet etching of the shoulder portion using an alkali.

The bottom surface of the memory hole MH is the (001) plane; and growth conditions can be selected appropriately so that the growth rate of the silicon is faster for the (111) plane 85 than for the (001) plane of the silicon crystal.

Accordingly, the growth of the silicon is promoted more selectively (preferentially) from the (111) plane 85 than from the bottom surface (the (001) plane) of the bottom region MHB. By growing the silicon selectively (preferentially) from the (111) plane 85, the protrusion 10b is formed in the lower region of the memory hole MH as shown in FIG. 16B.

By obstructing the growth from the bottom surface of the memory hole MH, the silicon (the protrusion 10b) plugs the memory hole MH while forming the void v at the vicinity of the bottom surface of the memory hole MH.

Subsequently, similarly to the processes described above, the formation of the columnar portions CL, the replacement of the sacrificial layers 71 with the electrode layers 70, etc., are continued; and the structure shown in FIG. 17 is obtained.

In the example shown in FIG. 16A to FIG. 17 as well, because the silicon growth from the (111) plane 85 is caused to be dominant in the formation of the protrusion 10b, it is possible to suppress the fluctuation of the upper end position (the upper end height) between the multiple protrusions 10b even in the case where the depths (the positions of the bottom surfaces) of the multiple memory holes MH fluctuate due to the RIE.

Also, the growth of the silicon can be promoted selectively (preferentially) more from the side wall than from the bottom surface of the bottom region MHB by setting the bottom surface of the bottom region MHB to be monocrystalline, and by setting the side wall to be polycrystalline or amorphous so that the crystallinity is worse than monocrystalline.

In the embodiments described above, the insulating layers (the second layers) 72 may be removed by etching through the slits ST; and the region between the electrode layers 70 adjacent to each other above and below may be an air gap.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
    a silicon substrate including a plurality of silicon protrusions having columnar configurations, and a void being formed below the protrusions;
    a stacked body provided on the substrate, the stacked body including a plurality of electrode layers stacked with an insulator interposed; and
    a semiconductor body contacting the protrusion and extending through the stacked body in a stacking direction of the stacked body,
    upper ends of the protrusions being positioned at a height between a lowermost electrode layer and an electrode layer of a second layer from a bottom of the electrode layers,
    the substrate including a lower region and an upper region, the upper region being provided in a hole formed in the substrate, the hole having a bottom surface and a side surface substantially perpendicular to the bottom surface, the void being provided between the upper region and the lower region, the lower region contacting the bottom surface of the hole and not contacting the void, the protrusions being silicon crystals grown in the hole,
    a maximum width of the void being smaller than a width of the bottom surface, and
    an impurity concentration at the lower region being different from an impurity concentration at the upper region.

2. The device according to claim 1, wherein a chlorine concentration of the lower region is higher than a chlorine concentration of the upper region.

3. The device according to claim 1, wherein a carbon concentration of the lower region is higher than a carbon concentration of the upper region.

4. The device according to claim 3, wherein the carbon concentration of the lower region is $3\times10^{19}$ cm$^{-3}$ or more.

5. The device according to claim 1, wherein a phosphorus concentration of the lower region is higher than a phosphorus concentration of the upper region.

6. The device according to claim 5, wherein the phosphorus concentration of the lower region is $3\times10^{19}$ cm$^{-3}$ or more.

7. The device according to claim 1, further comprising a charge storage portion provided between the semiconductor body and one of the electrode layers.

8. The device according to claim 1, wherein the voids are formed below 90% or more of protrusions of the plurality of protrusions.

9. The device according to claim 1, wherein the substrate includes an intermediate region between the lower region and the void, and the intermediate region is a silicon crystal grown from the bottom surface of the hole.

* * * * *